United States Patent [19]

Boehringer

[11] 4,016,459
[45] Apr. 5, 1977

[54] PROTECTIVE SYSTEM FOR INTERMITTENTLY OPERATING SEMICONDUCTOR SWITCH

[75] Inventor: Andreas Boehringer, Stuttgart, Germany

[73] Assignee: Robert Bosch G.m.b.H., Stuttgart, Germany

[22] Filed: Aug. 12, 1975

[21] Appl. No.: 604,007

[52] U.S. Cl. .............................. 361/88; 323/22 T; 361/78
[51] Int. Cl.² ........................................ H02H 3/20
[58] Field of Search ............... 317/31, 33 SC, 33 R, 317/27 R, 33 R; 321/14, 2, 18; 323/22 T, 19; 331/113 R, 108 A; 307/240, 242

[56] References Cited

UNITED STATES PATENTS

| | | | |
|---|---|---|---|
| 3,573,598 | 4/1971 | Clark et al. | 321/14 X |
| 3,587,002 | 6/1971 | Ipswich | 331/113 R |
| 3,675,160 | 7/1972 | Staker | 331/113 R |
| 3,702,434 | 11/1972 | Ryan | 323/22 T X |
| 3,733,540 | 5/1973 | Hawkins | 323/22 T X |
| 3,737,756 | 6/1973 | Hasley et al. | 323/22 T X |
| 3,740,668 | 6/1973 | Chopra | 331/113 R |
| 3,839,668 | 10/1974 | Black | 321/18 X |
| 3,855,520 | 12/1974 | Stich | 317/31 X |
| 3,859,586 | 1/1975 | Wadlington | 321/14 X |
| 3,893,043 | 7/1975 | Fukuoka | 321/18 X |

*Primary Examiner*—J D Miller
*Assistant Examiner*—Patrick R. Salce
*Attorney, Agent, or Firm*—Flynn & Frishauf

[57] ABSTRACT

A cyclical ON-OFF control signal is generated with a predetermined duty cycle to energize a load through a semi-conductor switch; a trouble signal is generated, for example by sensing voltage across the load, across the switch, temperature or the like, and, when the trouble signal exceeds a certain threshold (as determined, for example, by comparing the trouble signal with a reference in a differentially connected operational amplifier), the ON-signal to gate the switch ON is interrupted; and an OFF cycle of the cyclical generating means is started; if the trouble signal disappears, the normal cyclical repetition rate continues. A minimum interruption time is, however, provided determined by the OFF period of the cyclical generator and/or circuit components.

18 Claims, 4 Drawing Figures

PROTECTIVE SYSTEM FOR INTERMITTENTLY OPERATING SEMICONDUCTOR SWITCH

The present invention relates to a system to protect a semiconductor switch which operates intermittently, in accordance with a predetermined duty cycle, for example to control current flow to a permanent magnet motor; it is, however, applicable to control current flow through any load.

Various protective circuits have been proposed. One such circuit disconnects power to the load when a sensed overload, or other occurs. After disconnecting the semiconductor switch, the switch does not, however, reconnect automatically.

It is an object of the present invention to provide a supervisory control circuit, or, more specifically, a protective system for intermittently operating semiconductor switches, which will automatically re-connect and continue with their previously set duty cycle if the trouble condition should clear itself.

SUBJECT MATTER OF THE PRESENT INVENTION

Briefly, the protective system is so arranged that the electronic semiconductor switch is re-connected from blocked to conductive condition after a predetermined minimum time.

In accordance with a feature of the invention, means are provided generating a cyclincal ON-OFF control signal having a predetermined duty cycle; a controlled semiconductor switch is connected to and controlled by the control signal generating means, so that its switching state is controlled thereby. An overload, or other malfunction signal is generated and a supervisory protective circuit is controlled by the overload, or malfunction signal and connected to the control signal generating means to interrupt the ON control from said control signal generating means to the controlled semiconductor switch and provide, instead, an instantaneous OFF control signal thereto while initiating also the OFF cycle of the cyclical signal generator. The ON-control signal thus is interrupted until the next ON control signal is supplied by the control signal generating means.

The invention will be described by way of example with reference to the accompanying drawings, wherein.

Figure 1:
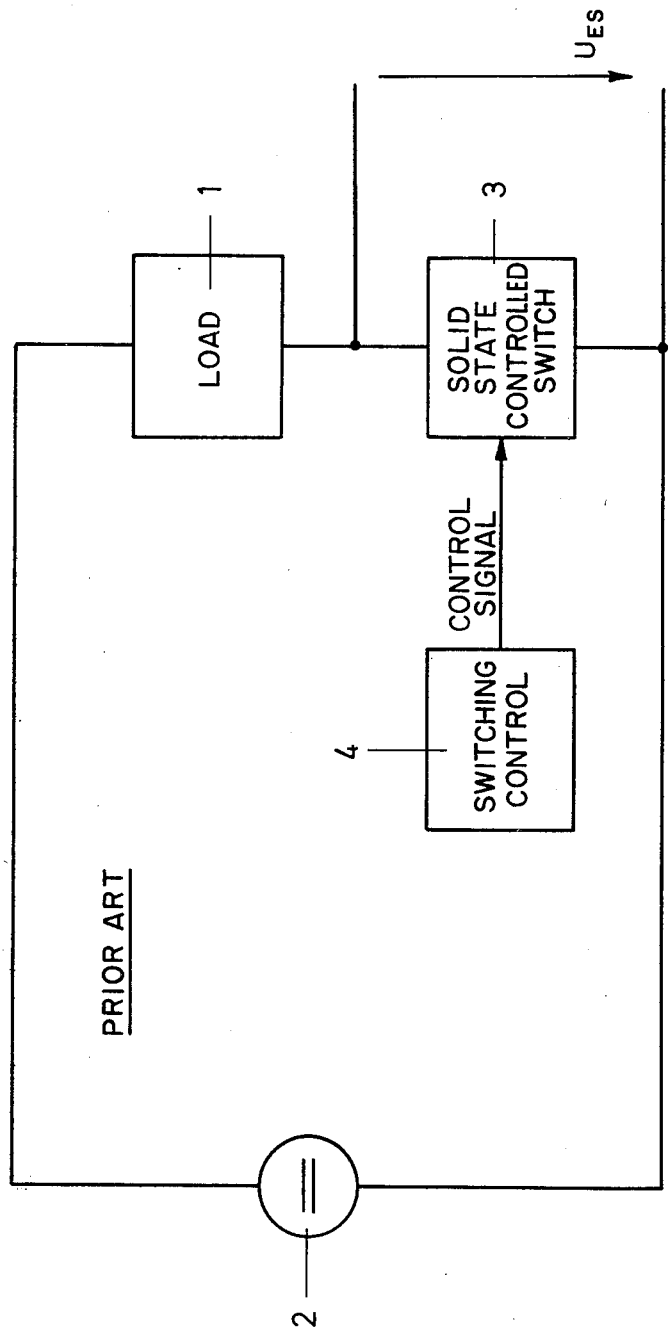
FIG. 1 is a general schematic diagram of a system to which the present invention is applied.

FIG. 1 illustrates the essential components of the subject matter of the present invention which, also, is that of the prior art. A d-c source 2 provides current to a load 1, which current is connected in cyclical pulses, having predetermined ON periods and OFF periods. The solid-state controlled switch 3 is controlled by a control signal derived from switching control 4 to be either in a conductive state $a$, in which the switch 3 has as low a switching voltage drop as possible, that is, is as close to ideally conductive as possible, and a blocked, or "open" state in which the solid-state controlled switch 3 has an extremely high, preferably almost open circuit resistance $b$.

The solid-state controlled switch 3 can consist of various components, such as a single switching transistor, a parallel connection formed of a plurality of switching transistors, one or more Darlington connected transistors, a parallel connection of a plurality of Darlington stages, or a combination thereof. ratio Power supplied to load 1 is controlled by changing the ON state with respect to the OFF state of the switch 3, that is, by changing the relative timing and duration of the conductive state $a$ with respect to the blocked state $b$ of the switch 3. By changing the duty cycle, therefore, of switch 3, the energy supplied to load 1 is varied. If the average power, over time, that is, the energy to be supplied to load 1 is to be increased, then the ratio between the conductive state $a$ with respect to the blocked state $b$ of switch 3 is increased; to decrease the supply of energy, the duty cycle, or the ration of $a/b$ is decreased.

Figure 2:
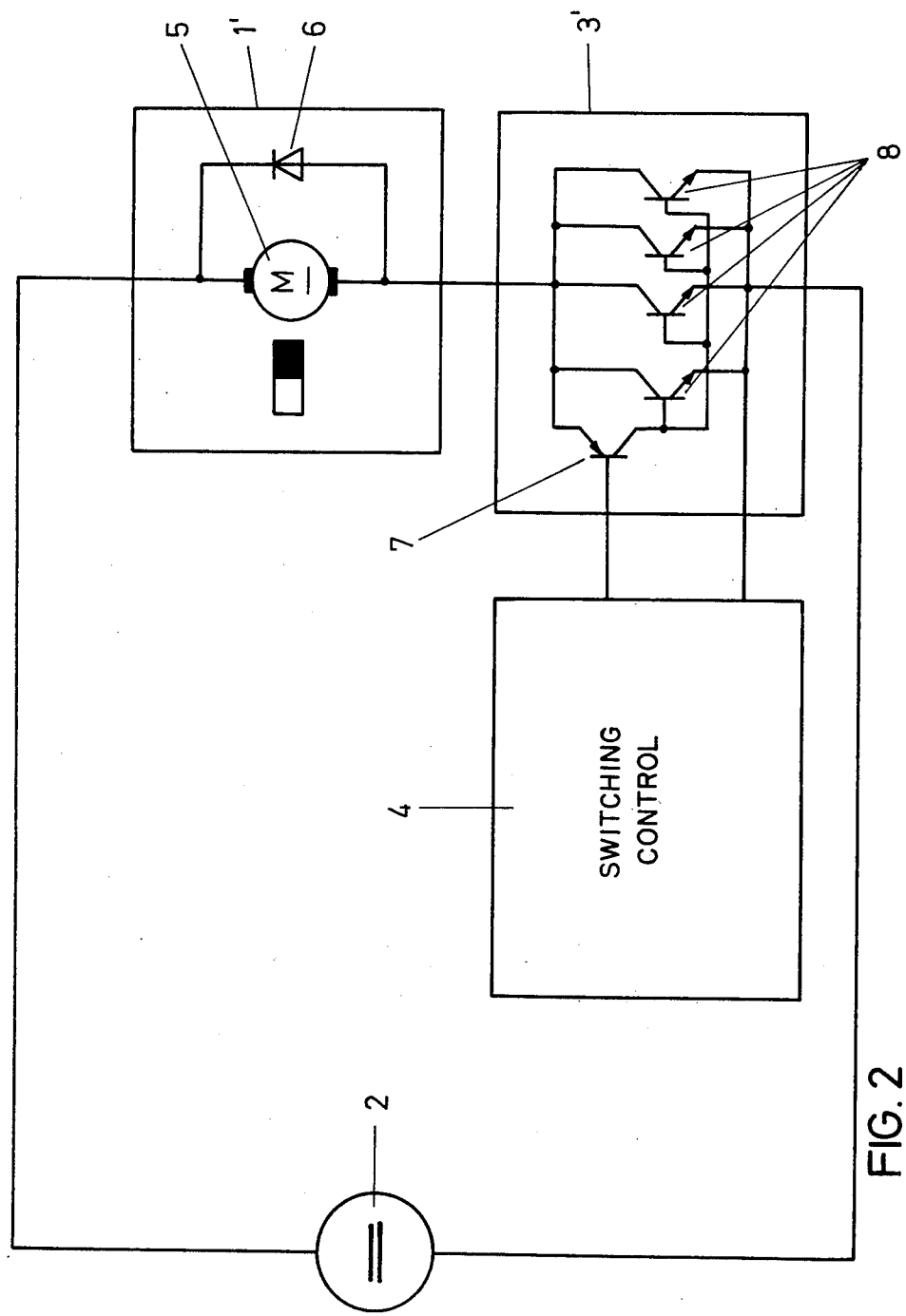
FIG. 2 is a more detailed diagram of the system showing a load being formed by a permanent magnet motor.

A typical application for such a control is illustrated in FIG. 2, in which the load ' is formed of a permanent magnet motor 5, having a freewheeling diode 6 connected in parallel to the armature thereof. The freewheeling diode 6 permits current flow through the motor even when the switch 3' is in blocked state. The electronic circuit which forms the switch 3' is here shown as a group of transistors 8, having base current applied thereto by a pnp transistor 7, connected in a Darlington circuit. The base of the driver transistor 7 of the Darlington circuit is controlled by having current supplied by switching control 4. Switching control 4 supplies sufficiently high base current to the transistor 7 to effect preferably complete saturation of the transistors 8 when in conductive state 2; and when lacking base current, to have a high, blocked state resistance in state $b$.

If the counter emf of the motor 5 changes, or if the voltage from the source 2 is subject to substantial variations, overloading of the switch 3 when in conductive state $a$ may result.

Overloading state of the electronic switch 3' can be sensed by measuring the voltage across the solid-state switch 3'. This voltage $U_{ES}$ (FIG. 1) can be sensed easily, practically free from losses, and with a suitable voltage output. The voltage $U_{ES}$ provides a particularly good characteristic for the load state of a solid-state controlled switch 3, for example of the type shown in FIG. 2. Failure of the one or the other of the transistors does not cause overloading of the remaining transistors which are still operative due to the sub-division of the current paths. The power supply capability of the entire arrangement does, however, decrease.

Figure 3:
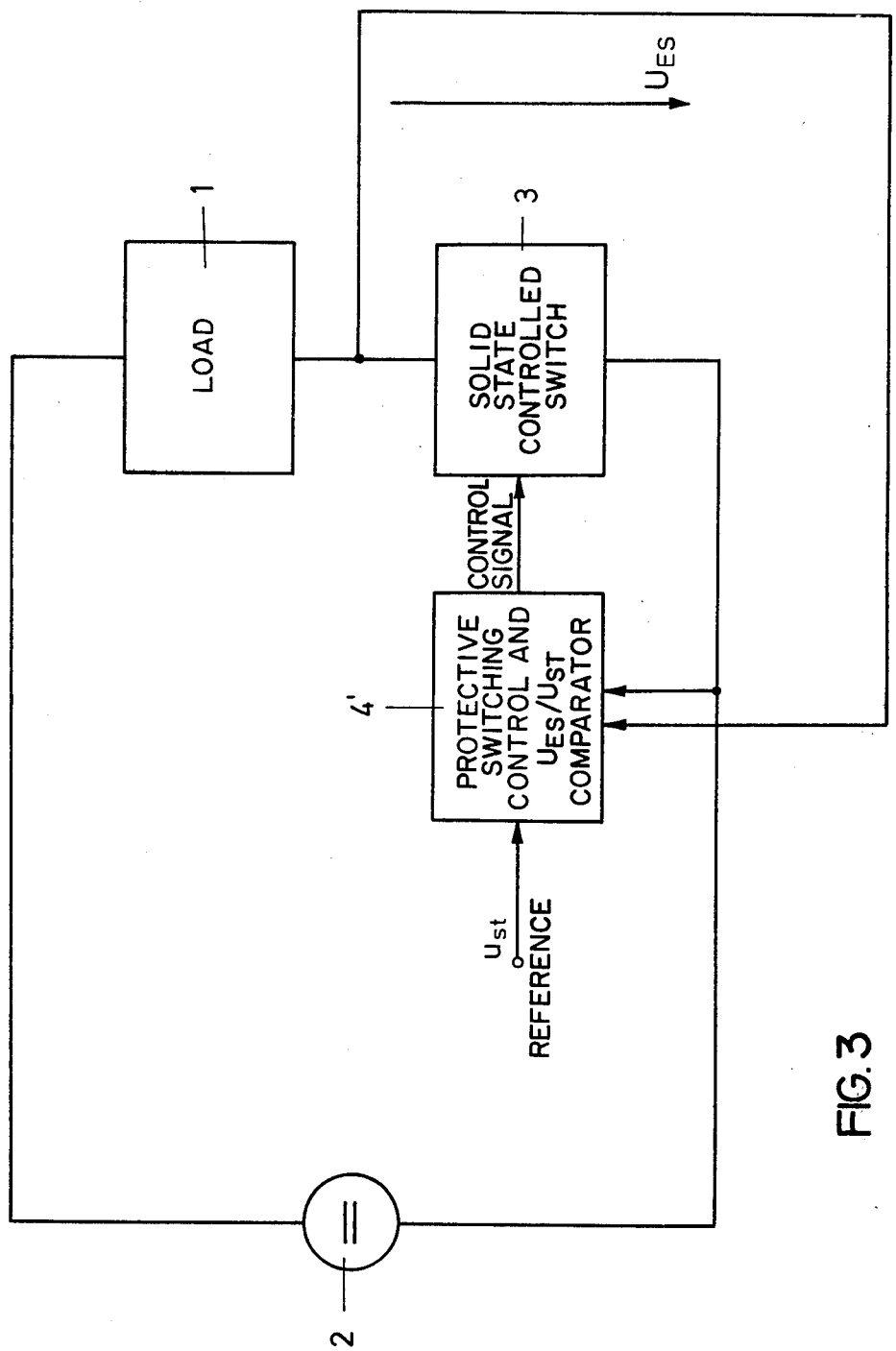
FIG. 3 is a highly schematic diagram illustrating the system of the present invention in block form.

The voltage $U_{ES}$ (FIG.1) which occurs across the solidstate controlled switch 3 is applied, in accordance with FIG. 3, to a protective switching control and comparator 4'. Stage 4' effects comparison of the voltage $U_{ES}$ with a reference which, if desired, may be adjustable and which is so dimensioned that it determines a permissible limiting or threshold value. If the threshold value is exceeded, the solid-state controlled switch 3 is controlled from conductive state $a$ into blocked state $b$ and will remain in the blocked state $b$ for a certain minimum period of time so that, upon subsequent switchover into conductive state $a$, the limiting or threshold value is not immediately reached again.

The switching control 4, or 4', may operate in accordance with various pulse generating principles, for example pulse width modulation, pulse repetition rate modulation, or a combination hereof. To provide for good continuous power supply to the load, particularly when the load is a rotating one, it is desirable that the control signal derived drom element 4, or 4', is synchronized, even if a switch-off command is derived as a result of sensing of and excessive signal $U_{ES}$, in such manner that the switching control continues to operate as if there were no turn-off command received as a result of an excessive signal $U_{ES}$.

A reference voltage $U_{st}$ is provided, connected to the stage 4' to control the pulses forming the control signal applied to the solid-state controlled switch 3, in accordance with pulse width modulation, pulse repetition rate, or a combination thereof, as desired, and commanding the switch 3 to change between conductive state a and blocked state b as controlled by the control signal. The reference $U_{st}$ may be variable, and may, in turn, be derived from another control circuit. The power supplied to the load 1 is controlled by varying the ratio of the ON state to the OFF state of the switch 3, that is, by varying the duty cycle thereof.

In accordance with the present invention, the switch 3, when conductive, is instantaneously controlled into blocked state b if a malfunction signal occurs indicating, for example that the voltage $U_{ES}$ exceeds the limit or threshold value. The state 4' is so arranged that it can switch back into conductive state only after a certain predetermined minimum time has elapsed.

Figure 4:
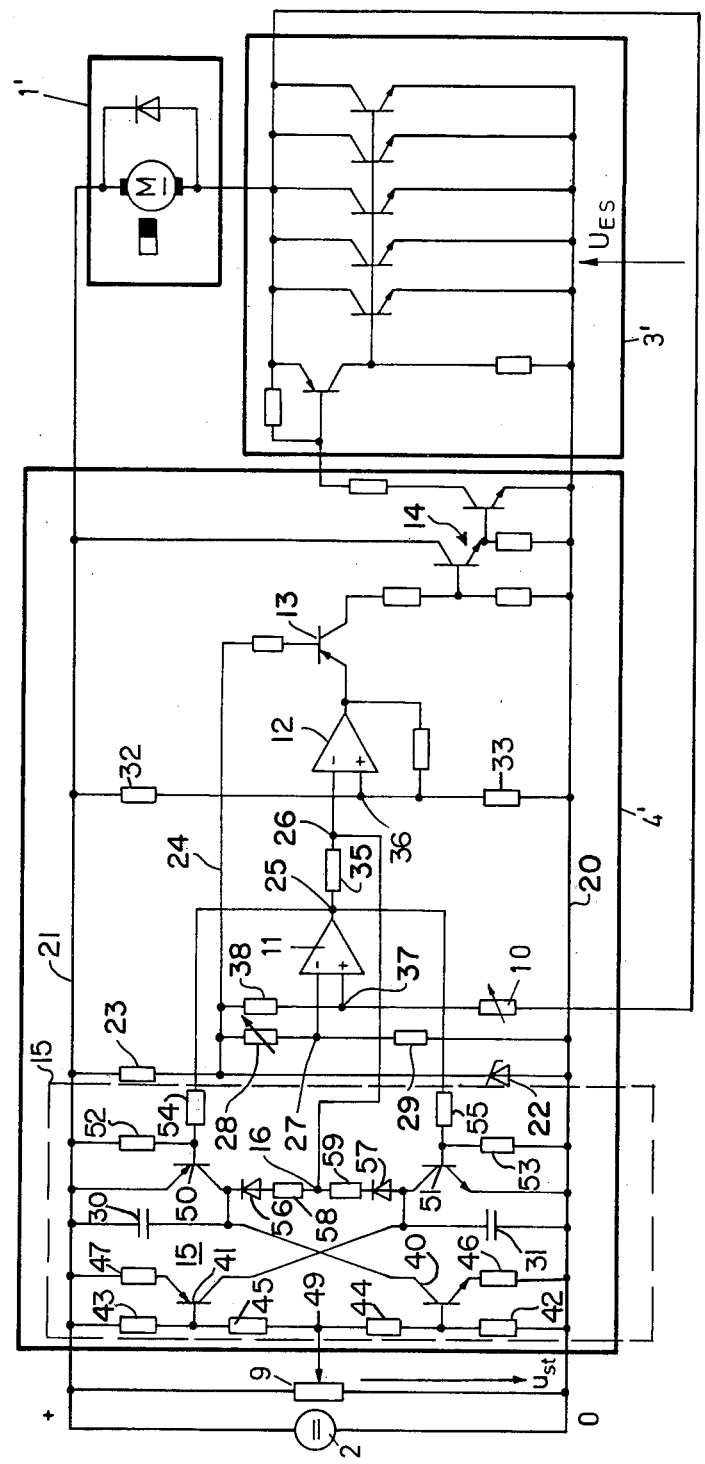
FIG. 4 is a schematic circuit diagram of the diagram of FIG. 3, in which the load is a permanent magnet d-c motor.

Referring now to FIG. 4: A d-c source 2 is connected to negative and positive buses 20, 21. Control voltage $U_{st}$ is derived from the slider terminal 49 of a potentiometer 9 connected across buses 20, 21.

The control voltage $U_{st}$, derived from slider 49, is connected to the end terminals of two voltage dividers 42, 44, 43, 45. The respective tap points of the voltage dividers are connected to bases of transistors 40, 41. Transister 41 is a pnp transistor, the emitter of which is connected through resistor 47 to bus 21, and the collector of which is connected to capacitor 31. The transistor 41, voltage divider 43, 45 and resistor 47 provide a controlled current source to charge capacitor 31 essentially linearly.

A second and completely complementary current source is formed of transistor 40, its emitter resistor 46 connected to negative bus 20, and the voltage divider 42, 44, the tap point of which is connected to the base of the npn transistor 40. Capacitor 30, connected to the collector of transistor 40, is charged by current flow therethrough.

The capacitors 30, 31 can be charged only when the parallel connected transistors 50, 51 are blocked or effectively open-circuited. A voltage divider formed of resistors 52, 54 is connected between bus 21 and the output of operational amplified 11. The tap point of the voltage divider is connected to the base of the pnp transistor 50. If the voltage at the output terminal 25 of the operational amplifier 11 is close to that of the positive bus 21, then transistor 50 will not receive base current and hence will be blocked. A complementary arrangement is connected across capacitor 31 and includes npn transistor 51, the base of which is connected to the tap point of a voltage divider formed by resistors 53, 55 connected between negative bus 20 and output terminal 25 of operational amplifier 11. If the voltage at point 25 is close to that of positive bus 21, then base current will be supplied to transistor 51 which will be conductive in saturation, thus effectively providing a short circuit across capacitor 31. As is apparent, the state of conduction of transistors 50, 51 depends on the voltage level of output terminal 25 of operational amplifier 11. If the voltage at terminal 25 is close to that of negative bus 20, then transistor 50 will be conductive and transistor 51 will be blocked. Capacitor 31 can then charge, whereas capacitor 30 is short-circuited. The circuit described so far is a voltage triggered double sawtooth wave generator generally denoted 15, and enclosed within the broken line in the circuit unit 4'. The output terminal 16 of the sawtooth wave generator is connected between two resistors 58, 59 each of which is connected by a respective diode 56, 57 to the collector of the transistors 50, 51. The diodes 56, 57 decouple the capacitors 30, 31, to which the collectors of the transistors 50, 51 are also connected, from each other. The output terminal 16 of alternately switching 15 is connected directly to the inverting input 26 of a second operational amplifier 12.

The second operational amplifier 12 has a direct input 36 which is clamped to a fixed voltage by being connected to the tap point of a voltage divider formed of resistors 32, 33 connected across buses 20, 21. The terminal 36 thus is connected to a reference voltage. The operational amplifier 12 is connected to the emitter of a transistor 13. The base of transistor 13 is connected through a base resistor to a regulated voltage line or terminal 24. Regulation of the voltage level of line or terminal 24 is obtained by connecting the terminal 24 of the junction point of a resistor 23 and a Zener diode 22 connected, respectively, across the buses 20, 21. Transistor 13 has its collector connected to a voltage divider which, in turn, controls the base of a driver transistor stage 14, connected to the semiconductor switch 3'. Semiconductor switch 3' is conductive when transistor 13, and hence driver transistor 14 are conductive; the non-conductive, or OFF state of switch 3' is controlled by flocking transistor 13 and hence blocking driver stage 14.

The circuit component 4', thus, essentially includes:
1. a triggerable sawtooth wave generator 15;
2. an operational amplifier 12, and amplifier and driver stages to control the duty cycle of the switch 3'; and
3. additionally it includes a synchronization and supervisory circuit.

The supervisory and synchronization circuit in essence is formed by operational amplifier 11, operated as a comparator, and associated circuitry. The inverting input 27 of operational amplifier 11 is connected to a reference voltage, derived from line or terminal 24 and suitably set by means of a voltage divider 28, 29 of which resistor 28 can be variable to change the reference voltage. Direct input 37 of operational amplifier 11 is connected to the junction of a voltage divider formed of resistors 10, 38. Resistor 38 is connected to the reference voltage at bus or line 24; the other terminal of resistor 38 is connected to terminal 37 forming the direct input or operational amplifier 11 and to the variable resistor 10. The other terminal of variable resistor 10 is connected to the junction between switch 3' and the load 1', and thus has a voltage representative of the voltage $U_{ES}$ applied thereto. The output 25 of operational amplifier 11 affects the voltage at the inverting input of operational amplifier 12 by being applied thereto over coupling resistor 35 and junction 26. Additionally, the output of operational amplifier 11 triggers the sawtooth wave generator 15 by being fed back to the voltage divider formed by resistors 52, 54 and 53, 55, respectively, which alternately block and render conductive transistors 50, 51 and hence permit charging or discharging of capacitors 30, 31, respectively.

Operation, with reference to FIG. 4:

a. normal conditions: switch 3' is not overloaded, voltage $U_{ES}$ is less than permissible value.

Let is be assumed first that the stage 4' is just about to cause switch 3' to become conductive; the voltage at potentiometer 9 is assumed to be at about intermediate level. Transistors 40, 41 operate as current sources and have equal collector currents. In normal conditions, as assumed, voltage $U_{ES}$ is less than the permitted maximum value when the switch 3' is connected. The voltage at junction 37 (direct input of operational amplifier 11) then will be more negative than the voltage at junction 27, derived from the reference line or bus 24. The output 25 of operational amplifier 11 will then be at a low voltage, close to that of bus 20. Voltage divider 52, 54 will hold transistor 50 in conductive state, thus short-circuiting capacitor 30; transistor 51 will be blocked and capacitor 31 can charge with the constant collector current derived from transistor 41 at a rate which is approximately linear with respect to time. Switch 3' will be on. When the voltage of capacitor 31 becomes greater than the voltage at voltage divider 32, 33, connected to the direct input of operational amplifier 12, diode 57 will become conductive and the capacitor voltage of capacitor 31 applies current to the inverting input 26 of the operational amplifier 12. Operational amplifier 12 will switch to a low output, and transistor 13 as well as driver transistor 14 for switch 3' will instantaneously block. Switch 3' will thus be OFF. The voltage $U_{ES}$ jumps suddenly to approximately the value of bus 21. Resistor 10 applies this voltage jump to the direct input 37 of operational amplifier 11. This voltage will then exceed the reference voltage at terminal 27 and the output of operational amplifier 11 will switch from a low value to a high value, that is, close to that of bus 21. This provides positive feedback for the OFF voltage at terminal 16 and additionally short-circuits capacitor 31 through transistor 51, controlled over voltage divider 53, 55. Transistor 50, now blocked, permits capacitor 30 to charge with the constant collector current of the other transistor 40.

The OFF state of switch 3' will continue. During the OFF time of switch 3', the voltage of capacitor 30 increases approximately linearly with respect to time until the reference voltage at the junction 36 to the operational amplifier 12 is passed. Diode 56 will now become conductive and current will flow from the inverting input 26 of the operational amplifier 12 to capacitor 30. Operational amplifier 12 can thus change its state, and its high output voltage will cause conduction of transistor 13 which causes driver transistor 14 to again become conductive and hence command switch 3' to be in ON state. The previously discussed ON state will now continue, and the cycle will repeat.

Changing the position of the slider of potentiometer 9, that is, the voltage level at terminal 49, does not change the above-described cycle. The only change has been the current level of the current sources. If the slider is close to the upper end position of the bus 21, the OFF transistor 40 operating as a constant current source will provide a high current, and the ON transistor 41 a low current. The change rates of the capacitors 30, 31 will thus change. Capacitor 30 will charge rapidly and capacitor 31 will charge slowly (long ON, short OFF). The voltage at capacitor 31 commands the ON duration of the switch 3'. The voltage of capacitor 30 commands the OFF switching duration of switch 3'. Depending on the slider position of the potentiometer 9, the duty cycle of switch 3' can thus be changed, as desired. A condition of constant ON or permanent OFF is also possible and permitted. The control voltage $U_{st}$ can be derived by other means than a potentiometer, for example the control voltage can be supplied by a speed control circuit or from other control elements or systems.

b. Operation when the load limit of switch 3' is reached:

Let is be assumed again that the cycle begins as the stage 4' just commands the switch 3' to switch to ON, and that the slider 49 of potentiometer 9 is approximately in central position.

The load limit of the switch 3' is characterized by the voltage $U_{ES}$ reaching a limiting value when the switch 3' is in ON condition. This limiting value is determined by the level of the voltage at point 27, that is, the inverting input to operational amplifier 11. It can be adjusted by setting the voltage at point 27 by adjusting the variable resistance of the voltage divider resistor 28, connected to the reference voltage bus or line 24. If, while switch 3' is ON, an increase in loading on load 1' causes an increase in the voltage $U_{ES}$ to such an extent that the voltage at terminal 37 becomes positive with respect to the reference voltage at terminal 27, operational amplifier 11 is required to change state. The output 25 of operational amplifier 11 will rapidly jump to a value close to that of bus 21. This voltae jump is immediately transferred through coupling resistor 35 to terminal 26 of operational amplifier 12 which will immediately block transistor 13, thus causing, through transistor 14, to turn switch 3' to OFF state. Simultaneously, the high voltage or terminal 25 is transferred over voltage divider 53, 55 to transistor 51 to short-circuit capacitor 31, and thus block transistor 50 and permit charging of the capacitor 30 and controlling the OFF state of switch 3'. The sawtooth wave generator is thus, reset to a new state, starting with a new, OFF position of its duty cycle, as described in (a) above. Load current through load 1' will decrease during this period and, upon re-connection of the switch 3', the switch will be in normal condition.

The minimum OFF time of the switch 3' is determined by the maximum collector current of the transistor 40, operating as a current source, as well as by the capacity of capacitor 30, and the reference voltage applied by voltage divider 32, 33 to operational amplifier 12. The minimum OFF period can be controlled by suitable dimensioning of the resistors 42, 44, 46 and of capacitor 30, and can be changed within wide limits. The minimum OFF time of the switch can thus be matched to both ohmic as well as inductive loads having counter-emf. Even if the load is an almost completely resistive load, reliable operation of the circuit is ensured.

Various changes and modifications may be made within the scope of the inventive concept. For example, the malfunction signal need not be an overload signal $U_{ES}$ derived across the switch 3' itself; it may be a different malfunction signal, applied to the direct input 37 of operational amplifier 11 and derived from a different sensing circuit, system or transducer; for example, it may be derived from a temperature sensor to determine excessive temperatures within a supervised system. Excessive current through the load, insufficient base current or controlled current to controlled transistors, or other malfunction parameters may be sensed and a malfunction signal applied to terminal 37 of operational amplifier 11.

More than one operating parameter may be sensed, and in this case additional malfunction signals can be coupled to terminal 37; such signals are preferably applied thereto through de-coupling diodes and, if additional signals are coupled to terminal 37, a suitably poled diode should be inserted between terminal 37 and resistor 10. Application of a malfunction signal from any one of those circuits then connected to terminal 37 will cause interruption of an ON pulse from source 15 to the switch 3.

If the position of the slider 49 on potentiometer 9 is set in such a way that the switch is constantly ON, so that there will be no OFF time of the stage 15, then the minimum OFF time will be determined by the maximum collector current of transistor 40 and the capacity of capacitor 30 and the relative values of the other circuit components. If the malfunction signal disappears, the switch 3' will be commanded to revert to continuous ON time after this minimum OFF time. Operational amplifier 11 provides an override signal at its output terminal 25 even if no OFF time signal is fed back to this terminal through resistor 35 if the setting of slider 49 on potentiometer 9 is such as to provide for "constant ON". If the setting of the slider 49 on potentiometer 9 should be such that the duty cycle is less than 100 percent, then the OFF time of the switch will be the OFF time as determined by the duty cycle.

I claim:

1. Protective system for an intermittently operating semiconductor switch (3), said switch comprising
    an astable circuit means (9, 15) generating a cyclical ON-OFF control signal having a predetermined duty cycle and including a timing circuit (30, 40; 42, 44, 46) having a minimum OFF time and determining the OFF time of the control signal;
    the controlled semiconductor switch (3) being connected to and controlled by said control signal generating means, and having its switching state controlled thereby;
    said system comprising
    a malfunction detection circuit generating a malfunction signal ($U_{ES}$);
    and a supervisory protective circuit (10, 11, 27, 37, 25, 35, 26) controlled by said malfunction detection signal ($U_{ES}$) and having its output connected to, the timing circuit (30, 40; 42, 44, 46) to initate an OFF timing interval of at least said minimum OFF time duration determined by the timing circuit, and hence interrupt the ON control from said control signal generating means (15) to the controlled semiconductor switch (3) and providing, instead, an instantaneous OFF control signal to the controlled semiconductor switch (3), said minimum OFF timing interval being selectable independently of the ON-OFF timing of said cylical ON-OFF control signal generated by the astable circuit means; said astable circuit means (9, 15) generating the cyclical ON-OFF control signal reverting to the ON state elapse of at least the minimum OFF time interval controlled by the timing circuit thereof.

2. System according to claim 1, wherein the malfunction detection circuit means comprises
    a comparator (11) comparing a reference signal (22, 23, 24; 28, 29, 27) with a singal ($U_{ES}$) reprsentative of loading of the semiconductor switch (3) and providing an output signal to the protective circuit when a predetermined threshold value of the loading signal with respect to the referrence signal is exceeded.

3. System according to claim 2, wherein the reference signal is of variable value.

4. System according to claim 2, wherein the comparator comprises an operational amplifier (11);
    a voltage divider (28, 29) is provided having adjustable voltage division ratio and connected to one input terminal (27) of the operational amplifier, the other input terminal (37) being connected to the semiconductor switch (3') to effect a comparison between the signal from the switch and the signal derived from the voltage divider.

5. System according to claim 1, wherein the switch (3) is connected to a load (1) and said malfunction detection circuit means (10) comrises means genterating a signal representative of at least one parameter potentially destructive of the semiconductor switch (3) or of the load (1) connected thereto.

6. System according to claim 5, wherein said at least one parameter comprises a voltage ($U_{ES}$) appearing across said semiconductor switch (3).

7. System according to claim 1, wherein said control signal generating means comprises a triggerable wave generator (15) providing an output signal having alternating characteristics commanding said semiconductor switch (3) sto be ON, or OFF, respectively, for predetermined ON time periods and predetermined OFF time periods, respectively;
    and said supervisory protective circuit has its input (27, 37) controlled by the malfunction detection signal ($U_{ES}$) and has its output connected to the triggerable wave generator to control the triggerable wave generator to change to the state providing an output signal controlling the switch to be OFF upon presence of a malfunction signal.

8. System according to claim 7, wherein the control signal generating means comprises
    a pair of capacitors (30, 31), one (31) of which controls the output signal to have the ON command characteristic and the other (30) the OFF command characteristic;
    charge and discharge control means (40, 41; 50, 51) connected to charge and discharge the respective capacitors;
    and adjustable control circuit means (9, 49; 42, 44; 43, 45) connected to the charge control means to alternately effect charging of the capacitors, the discharge control means being connected in circuit with the capacitors and the charge control means to provide for discharge of the respective capacitor which is not being charged, and to provide said output signal having said alternating characteristic;
    and wherein the supervisory protective circuit is connected (54, 55) to the charge/discharge control means of that one of the capacitors (30) providing said OFF command.

9. System according to claim 7, wherein the supervisory protective circuit further includes
    a comparator (11) having said malfunction detection signal ($U_{ES}$) applied thereto and providing an output indicative that said malfunction signal has exceeded a predetermined level;
an operational amplifier (12) providing an output signal to the semiconductor switch (3) at resective levels commanding ON or OFF state of said switch;
the input (26) to said operational amplifier (12) being connected to the output (16) of said triggerable wave generator (15);
and a feedback circuit (35, 54, 55) connecting the output of the comparator (11) to the triggerable wave generator (15) to control said triggerable wave generator to commence to assume the state commanding the operational amplifier (12) to provide an OFF signal to the switch.

10. System according to claim 9, wherein the triggerable wave generator (15) comprises one branch (31, 41, 51) controlling the time period of one state thereof characteristic of the ON signal and the other branch (30, 40, 50) controlling the time period characteristic of the OFF signal, said branches including circuit means (50, 51) cyclically carrying current or essentially being of current flow for said respective predetermined time period;
and wherein the feedback circuit feeds back current to the non-current-carrying element when the comparator (11) senses a malfunction signal in exesss of said level to immediately initiate the time period and the state of the triggerable wave generator representative of the OFF command.

11. System according to claim 7, wherein the triggerable wave generator comprises a pair of complementary charge control transistors (40, 41);
a pair of capacitors (30, 31), respective transistors being connected to respective capacitors to charge the capacitors at an essentially uniform time rate;
a pair of respective complementary discharge control transistors (50, 51) connected across respective capacitors (30, 31) to control the discharge of the capacitors;
control circuit means (9, 49; 42, 44, 43, 45) connected to said charge control transistors (40, 41) to control the respective charge duration of the respective capacitors; an operational amplifier, operated as a comaprator (12), having its output connected to control the state of the switch (3);
a coupling circuit (56, 58, 57, 59; 16) including diodes (56, 57) connecting the capacitors to the comparator (12) and transferring a signal thereto representative of the charge state of the respective capacitors and controlling said comparator (12) which turns switch (3) ON or OFF;
and wherein the supervisory protective circuit comprises a coupling circuit (10, 11) connected (25) to the discharge transistors and providing a signal thereto of such polarity that the respective discharge transistor (51) which controls the capacitor (31) which, when charged, connects the respective ON signal to the comparator (12) discharges said capacitor (31) and hence provide charge current to the other capacitor (30) through its respective charge transistor (40) so that the triggerable wave generator will immediately switch over and provide an OFF signal, the minimum time of persistence of said OFF command signal being determined by the charge rate of the charge current to said other capacitor (30).

12. System according to claim 11, wherein the malfunction signal is a signal representative of current flow through the load and has ON-OFF characteristics in accordance with cyclical operation of the switch (3) as well as amplitude representative of malfunction when the amplitude exceeds a reference value;
wherein the malfunction signal coupling circuit (10, 11) includes an operational amplifier (11) connected as a comparator and having a reference representative of said reference value, as well as said malfunction signal applied thereto, the output (25) of the operational amplifier (11) being connected to the coupling circuit to feed back a signal representative of said output, said operational amplifier (11) having a first output indicative of ON state of the switch, and a second output indicative of:
a. OFF state of the switch, or
b. the malfunction signal has exceeded the reference value.

13. System according to claim 1, characterized by means sensing a dangerous condition comprising at least one of: loading of the semiconductor switch; temperature rise of the semiconductor switch or of the load; excessive current through the semiconductor switch; and providing an output signal controlling said protective circuit to interrupt application of an ON pulse to said switch until at least said predetermined minimum time in OFF state has elapsed.

14. System according to claim 1, in combination with a pulse-controlled d-c motor and having means connecting said semiconductor switch (3) in series with a power supply to the motor, and a free-wheeling diode (6) connected in parallel with the motor to conduct current during pulse gaps or intervals;
and wherein the timing circuit (30, 40; 42, 44, 46) has a minimum OFF time interval which is matched to the constants of the motor-free-wheeling diode circuit.

15. Overload-protected, intermittently operating motor power supply system having
a source of power (2), a motor (M) and a semiconductor switch (3) connected in series with the source and the motor, comprising
a triggeragle wave generator (15) generating a cyclical ON-OFF signal connected to control conduction or non-conduction of the semiconductor switch (3) and hence connection or disconnection of the motor (M) from the source (2);
command means (9, 49) connected to the triggeragle wave generator and controlling its duty cycle, and hence the relative duration of the ON-OFF signal from the triggerable wave generator (15);
means (10) deriving an operating signal ($U_{ES}$) having
a. a polarity with respect to a first reference (20, 21) representative of conduction or non-conduction of said switch (3), and
b. an amplitude with respect to a second reference (24) representative of an operating characteristic of the circuit (1, 3);
and a supervisory protective circuit (11, 27, 37, 25, 35, 26, 36) connected to said triggerable wave generator (15) including a comparator (11) comparing the amplitude of said operating signal ($U_{ES}$) with respect to the second reference (24);
wherein, in accordance with the invention,
the triggerable wave generator (15) includes a timing circuit (30, 40; 42, 44, 46) determining the OFF time of the control signal as commanded by said command means (9, 49) and additionally having a minimum OFF time when energized;

said comparator (11) being connected in a feedback circuit to control the triggerable wave generator (15) to provide the OFF command signal when
1. said command means (9, 49) commands the triggerable wave generator to assume the state in its duty cycle to generate the OFF signal to command the semiconductor switch (3) to be non-conductive, or
2. the operating signal ($U_{ES}$) has an amplitude in excess of a predetermined level with respect to said second reference (24), whereby the comparator will provide, through the feedback circuit, a signal to the triggerable wave generator to change to OFF condition, whereupon the timing circuit (30, 40; 42, 44, 46) will initiate at least said minimum OFF time interval, the triggerable wave generator thereby providing, immediately, an OFF command signal persisting at least for said minimum time interval, or as commanded by said command means (9, 49) if the amplitude of siad operating signal has a non-permitted level with respect to said reference.

16. System according to claim 15, wherein the command signal from the command means (9, 49) is variable between values controlling the wave generator (15) for continuous ON or continuous OFF state.

17. System according to claim 15, wherein the triggerable wave generator (15) comprises an astable circuit having two cross connected timing portions, each including a timing capacitor (30, 31) and a control transisstor (40, 41) controlling charge on the respective capacitor, the command means controlling the charging through said control transistor under command of the command signal from the command means (9, 49), or, with respect to the transistor and capacitor (30, 40) controlling the OFF time, the OFF time being controlled by said operating signal ($U_{ES}$), the timing portion controlling the OFF time said timing circuit.

18. System according to claim 15, wherein said means deriving the operating signal comprises a connnection from the junction of the switch and the motor to the supervisory protective circuit.

* * * * *

UNITED STATES PATENT AND TRADEMARK OFFICE
CERTIFICATE OF CORRECTION

PATENT NO. : 4,016,459
DATED : April 5, 1977
INVENTOR(S) : Andreas BOEHRINGER

It is certified that error appears in the above–identified patent and that said Letters Patent are hereby corrected as shown below:

Claim 10, line 8, that is column 9 line 22, after "being" insert -- devoid --

Claim 15, penultimate line, that is column 12 line 1 change "siad" to -- said --

Signed and Sealed this

Fourteenth Day of June 1977

[SEAL]

Attest:

RUTH C. MASON
Attesting Officer

C. MARSHALL DANN
Commissioner of Patents and Trademarks